(12) United States Patent
Nakagawa et al.

(10) Patent No.: US 9,304,255 B2
(45) Date of Patent: Apr. 5, 2016

(54) OPTICAL DEVICE AND MANUFACTURING METHOD THEREFOR

(71) Applicant: International Business Machines Corporation, Armonk, NY (US)

(72) Inventors: Shigeru Nakagawa, Kawasaki (JP); Seiji Takeda, Yokohama (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/748,321

(22) Filed: Jun. 24, 2015

(65) Prior Publication Data
US 2015/0316719 A1    Nov. 5, 2015

Related U.S. Application Data

(63) Continuation of application No. 14/642,894, filed on Mar. 10, 2015.

(30) Foreign Application Priority Data

Mar. 27, 2014 (JP) ................. 2014-066547

(51) Int. Cl.
G02B 6/136 (2006.01)
G02B 6/122 (2006.01)
G02B 6/132 (2006.01)
G02B 6/12 (2006.01)

(52) U.S. Cl.
CPC ............... *G02B 6/136* (2013.01); *G02B 6/122* (2013.01); *G02B 6/132* (2013.01); *G02B 2006/12078* (2013.01); *G02B 2006/12128* (2013.01)

(58) Field of Classification Search
CPC ........ G02B 6/136; G02B 6/122; G02B 6/132; G02B 2006/12078; G02B 2006/12128
See application file for complete search history.

*Primary Examiner* — Nadine Norton
*Assistant Examiner* — Mahmoud Dahimene
(74) *Attorney, Agent, or Firm* — Cantor Colburn LLP; Keivan Razavi

(57) ABSTRACT

An optical device includes an SOI substrate, the embedded insulating layer having a thickness of 200 nanometers (nm) or less; an optical waveguide comprising a Group III-V compound semiconductor material formed on top of the SOI substrate; and an optical leakage preventing layer formed inside the SOI substrate on a bottom side of the optical waveguide to prevent leakage of light from inside the optical waveguide towards the SOI substrate.

5 Claims, 15 Drawing Sheets

US 9,304,255 B2

OPTICAL DEVICE AND MANUFACTURING METHOD THEREFOR

DOMESTIC AND FOREIGN PRIORITY

This application is a continuation of U.S. patent application Ser. No. 14/642,894, filed Mar. 10, 2015, which claims priority to Japanese Patent Application No. 2014-066547, filed Mar. 27, 2014, and all the benefits accruing therefrom under 35 U.S.C. §119, the contents of which in its entirety are herein incorporated by reference.

BACKGROUND

The present invention relates to an optical device used in optical communication and to a manufacturing method therefor.

There is increasing demand for faster, more densely integrated optical interconnects that consume less power when propagating light over short distances between chips in order to realize exascale computers able to perform $10^{18}$ calculations per second. Silicon photonics is a technology essential to meeting this demand. In silicon photonics, fine optical waveguides are created from silicon, and circuits composed of these optical waveguides are used as a platform.

An optical waveguide created using silicon photonics has a core serving as the optical path for propagating light, and cladding which covers the core. The cladding is designed to totally reflect light, confine the light inside the core, and enable light to be propagated without loss. Therefore, the optical waveguide requires a structure in which the light propagating through the waveguide is prevented from leaking towards the silicon substrate.

In this structure, a $SiO_2$ layer referred to as buried oxide layer is generally used as lower cladding for the optical waveguide (see, for example, the publication of Yasuhiko Arakawa, et al., "Silicon Photonics for Next Generation System Integration Platform", IEEE Communications Magazine, pp. 72-77, March 2013). An example of this structure is shown in FIG. 1. The structure shown in FIG. 1 includes a Si substrate 10, a $SiO_2$ layer 11 forming the lower cladding on top of the Si substrate 10, and a Si waveguide 12 formed on top of the $SiO_2$ layer. The $SiO_2$ layer 11 is formed to a thickness, for example, 2 μm, sufficient to prevent light propagating through the Si waveguide 12 from leaking towards the Si substrate 10.

Another structure is known in which the $SiO_2$ layer is etched away to form an air bridge in the Si waveguide which has an improved light confinement effect (see, for example, Laid-open Patent Publication No. 2003-215519, Laid-open Patent Publication No. 2004-341147, and the publication of Solomon Assefa, et al., "A 90-nm CMOS Integrated Nano-Photonics Technology for 25 Gbps WDM Optical Communications Applications", IEEE International Electronic Devices Meeting, Post Deadline Session 33.8, Dec. 10-12, 2012). An example of this structure is shown in FIG. 2. The structure shown in FIG. 2 includes a Si substrate 10, a $SiO_2$ layer 11 on top of the Si substrate 10, an air layer 13 formed inside the $SiO_2$ layer 11, and a Si waveguide 12 supported by the surface of the $SiO_2$ layer and formed above the air layer 13. The air layer 13 is formed to a thickness, for example, 2 μm, sufficient to prevent light propagating through the Si waveguide 12 from leaking towards the Si substrate 10.

SUMMARY

In one embodiment, an optical device includes an SOI substrate, the embedded insulating layer having a thickness of 200 nanometers (nm) or less; an optical waveguide comprising a Group III-V compound semiconductor material formed on top of the SOI substrate; and an optical leakage preventing layer formed inside the SOI substrate on a bottom side of the optical waveguide to prevent leakage of light from inside the optical waveguide towards the SOI substrate.

In another embodiment, a method for manufacturing an optical device includes etching an SOI substrate having an embedded insulating layer with a thickness of 200 nm or less to form a groove passing through the insulating layer from the surface of the SOI substrate; forming a Group III-V compound semiconductor layer; bonding together the SOI substrate with a formed groove and the Group III-V compound semiconductor layer so the opening of the groove faces the Group III-V compound semiconductor layer; and etching the Group III-V compound semiconductor layer to form an optical waveguide.

DETAILED DESCRIPTION

Figure 1:
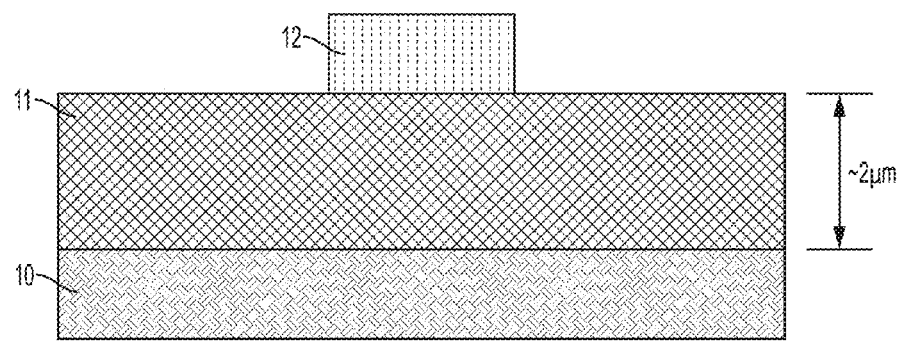
FIG. 1 is a diagram showing an example of the structure of a typical silicon photonics optical waveguide.
Figure 2:
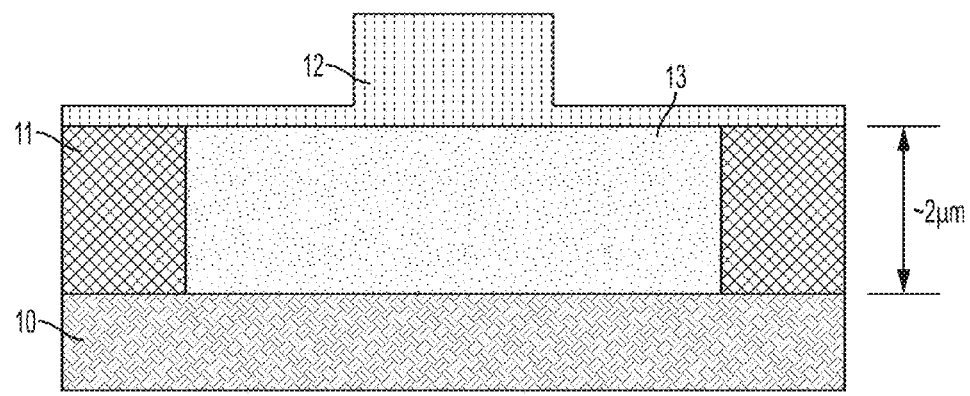
FIG. 2 is a diagram showing another example of a silicon photonics optical waveguide.

In the case of both the technologies described with respect to FIG. 1 and FIG. 2, when a $SiO_2$ layer 11 or air layer 13 is used as the lower cladding, the layer must be sufficiently thick, i.e. approximately 2 μm, relative to the wavelength.

However, in the case of silicon-on-insulator (SOI) substrates for digital logic circuits commonly used in the complementary metal oxide semiconductor (CMOS) process, the thickness of the $SiO_2$ layer formed on Si substrates is from 100 to 200 nm, and is sometimes even thinner.

An optical circuit (optical element) can be integrated with a digital circuit used in the CMOS process using the silicon photonics process but, as mentioned above, the required thickness of the $SiO_2$ layer in digital circuits and optical circuits is different. In order to integrate these circuits, either each one has to be integrated on a different SOI substrate, or both can be integrated on the same substrate with a $SiO_2$ layer thickness of 2 μm, but this sacrifices digital circuit performance.

It is potentially possible to obtain a perfect match between silicon photonics and the CMOS process, but this match cannot be obtained using prior art techniques.

In light of this problem, embodiments of the present invention provides an optical device including: an SOI substrate, the embedded insulating layer of which having a thickness of 200 nm or less; an optical waveguide made of a Group III-V compound semiconductor material formed on top of the SOI substrate; and an optical leakage preventing layer formed inside the SOI substrate on the bottom side of the optical waveguide to prevent leakage of light from inside the optical waveguide towards the SOI substrate.

Embodiments of the present invention provide an optical device enabling integration of an optical circuit on an SOI substrate having an insulating layer of the same thickness commonly used in the CMOS process, and realization of a perfect match between the silicon photonics and the CMOS process.

Figure 3:
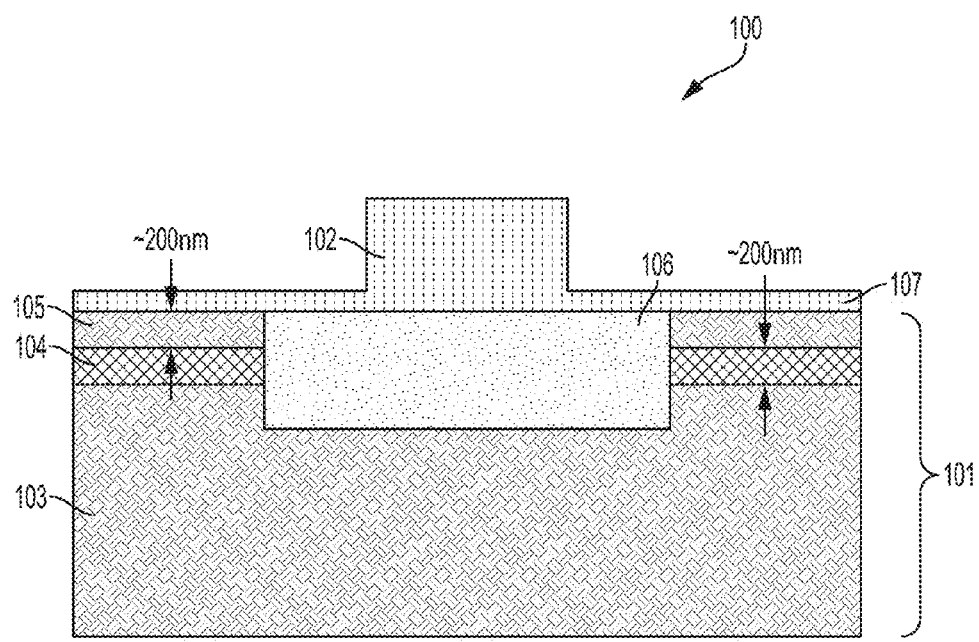
FIG. 3 is a diagram showing an example of the structure of an optical device according to an embodiment of the present invention.

The following is a more detailed explanation of the present invention with reference to the embodiments shown in the drawings. However, the present invention is not limited to the embodiments described below. FIG. 3 is a diagram showing an example of the structure of an optical device according to the present invention. This optical device enables an optical element such as an optical waveguide, optical modulator, laser element light source, or photo-detector to be integrated with a CMOS element such as a digital circuit on an SOI substrate having an embedded insulating layer of 200 nm commonly used in the CMOS process. This optical device is able to realize the perfect matching of silicon photonics with the CMOS process.

Here, a CMOS is a gate structure in which the metal oxide semiconductor field effect transistor (MOSFET) for the n channel turned on by the application of positive voltage to the gate is arranged in complementary fashion with the MOSFET for the p channel turned on by the application of negative voltage to the gate. These are used as a CMOS electrode in a digital circuit such as a flip-flop, counter, shift register, adder, or multiplier. A SOI substrate is a substrate in which an insulating layer is interposed between the silicon (Si) substrate and the surface Si layer. An optical waveguide is a propagation path for light during optical communication. An optical modulator is a circuit that applies a signal to light (performs optical modulation) in a signal transmitter, and a photo-detector is a circuit that extracts the signal from the light (performs optical demodulation).

The optical device 100 shown in FIG. 3 includes an SOI substrate 101, and an optical waveguide 102 on top of the SOI substrate 101. The SOI substrate 101 is composed of a Si substrate 103, a thin insulating $SiO_2$ layer 104 on top of the Si substrate 103, and a thin Si layer 105 on top of the $SiO_2$ layer 104. The optical waveguide 102 is formed on the SOI substrate 101 so as to extend in the depth direction with a predetermined width and height.

There are no particular restrictions, but the thickness of the Si substrate 103 is from 0.5 to 1 mm, the thickness of the $SiO_2$ layer 104 is less than 200 nm as is commonly used in the CMOS process, specifically from 50 to 200 nm, and the thickness of the Si layer 105 on top is less than 200 nm, specifically, from 50 to 200 nm.

The optical device 100 includes an optical leakage preventing layer 106 formed inside the SOI substrate 101 below the optical waveguide 102. The optical leakage preventing layer 106 may be wider or narrower than the optical waveguide 102, but wider is preferable from the standpoint of simply and effectively preventing leakage of light. The optical leakage preventing layer 106 is a layer which prevents leakage of light propagating through the optical waveguide 102 from inside the optical waveguide 102 into the SOI substrate 101 and, more specifically, into the Si substrate 103.

The optical waveguide 102 basically reflects light off the boundary surface so that it propagates through the waveguide, but light that is not reflected at the boundary surface escapes as evanescent light. Because evanescent light is light that has leaked from the optical waveguide 102, propagation loss occurs. Therefore, an optical leakage preventing layer 106 wider than the optical waveguide 102 is provided to reduce the amount of evanescent light.

When light travels from a layer made of a material with a high refractive index into a layer made of a material with a low refractive index, the layer made of the material with a low refractive index forms a barrier to the light. Therefore, the material constituting the optical leakage preventing layer 106 is a material with a lower refractive index than the material constituting the optical waveguide 102.

The optical waveguide is made of a Group III-V compound semiconductor material. The Group III-V compound semiconductor propagates the required amount of light through the optical waveguide 102. Metal or electrodes are attached, and the light is diverted directly to the optical element serving as the active device.

Group III-V compound semiconductors are made of compounds with semiconducting properties compounded from Group III elements such as aluminum (Al), gallium (Ga), or indium (In), and from Group V elements such as nitrogen (N), phosphorus (P), arsenic (As), antimony (Sb). Specific examples include gallium arsenide (GaAs), indium phosphide (InP), gallium nitride (GaN), aluminum nitride (AlN), indium arsenide (InAs), indium antimonide (InSb), and gallium antimonide (GaSb). These compounds are compounded from only two elements. Compounds compounded from three or more elements, such as InGaAs, GaInNAs, and GaAsP, can also be used. The bandgap and refractive index of the semiconductor can be altered by changing the composition that is used.

The width w and height h of the optical waveguide 102 may be any width and height able to properly transmit signal-carrying light to its destination. In one example, the width can be from 500 to 750 nm, and the height is from 500 to 750 nm.

The refractive indices for the Group III-V compound semiconductors used in the optical waveguide 102 are approximately 3.9 for GaAs, approximately 3.5 for InP, approximately 2.4 for GaN, approximately 2.2 for AlN, approximately 4 for InN, approximately 4.3 for InSb, and approximately 5.2 for GaSb. The material used in the optical leakage preventing layer 106 may be any material with a lower refractive index than the material used in the optical waveguide 102. Examples include air, which has a refractive index of approximately 1, and resins (polymers) such as polyethylene, polyester, and acrylic resins, which have a refractive index approximately between 1.5 and 2.

The optical leakage preventing layer 106 may have any width as long as the width is greater than that of the optical waveguide 102, and as long as it can prevent leakage of evanescent light into the Si substrate. The height can be any height able to prevent leakage of evanescent light into the Si substrate 103. Because the Si layer 105 on the surface of the SOI substrate 101 and the $SiO_2$ layer 104 underneath are thin, a groove can be formed that passes through them, and the optical leakage preventing layer 106 can be formed inside the groove. In order to reliably prevent leakage of evanescent light, an optical leakage preventing layer 106 preferably passes through the $SiO_2$ layer 104.

When the optical leakage preventing layer 106 is an air layer, an optical waveguide support layer 107 is provided to support the optical waveguide 102. The optical waveguide support layer 107 is provided so as to form a bridge over the Si layer 105, and the optical waveguide 102 is supported in the middle. This structure is called an air bridge structure, and an optical waveguide in which an air bridge structure has been formed is called an air bridge-type optical waveguide. The optical waveguide support layer 107 may be made of a material that is or different from that of the optical waveguide 102, but it can be formed at the same time as the optical waveguide 102 if it is made of the same material.

Figure 4:
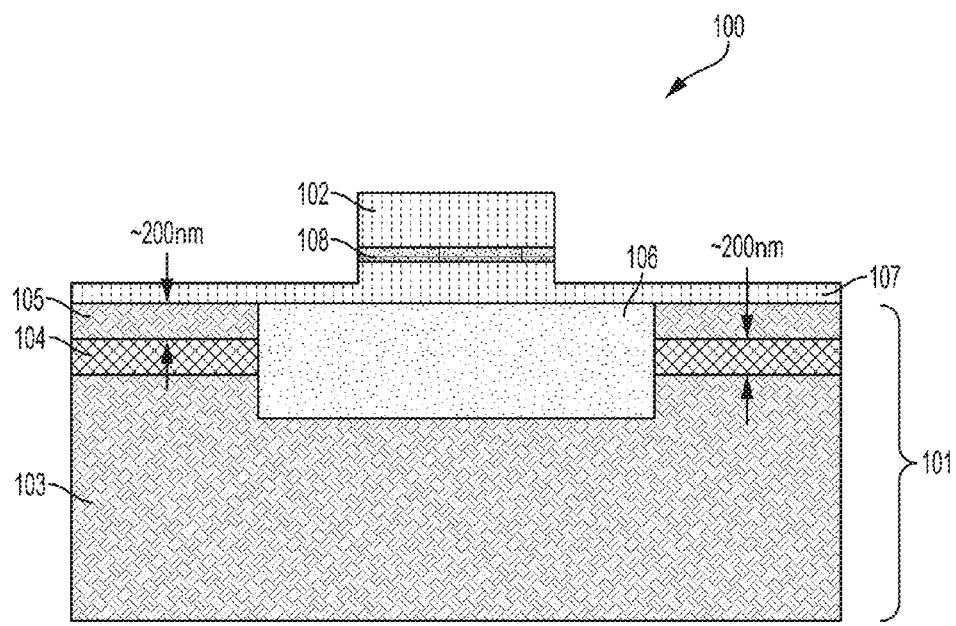
FIG. 4 is a diagram showing another example of the structure of an optical device according to an embodiment of the present invention.

The optical device 100 is not limited to the structure shown in FIG. 3. A quantum well layer 108 may be provided in the central portion of the waveguide 102 in the height direction as shown in FIG. 4. A quantum well layer 108 can be provided to impart the functions of an active device such as an optical modulator or laser element.

The quantum well layer 108 is made of a semiconductor material with a different bandgap than the Group III-V compound semiconductor material constituting the optical waveguide 102, and has a thickness from 1 to 10 nm. When the Group III-V compound semiconductor material is InP, the material used in the quantum well layer 108 can be InAs or InGaAs which have a smaller bandgap. Here, there is a single quantum well layer 108. However, a multiple quantum well structure with two or more layers is preferred in order to improve the functions of the active device.

Figure 5:
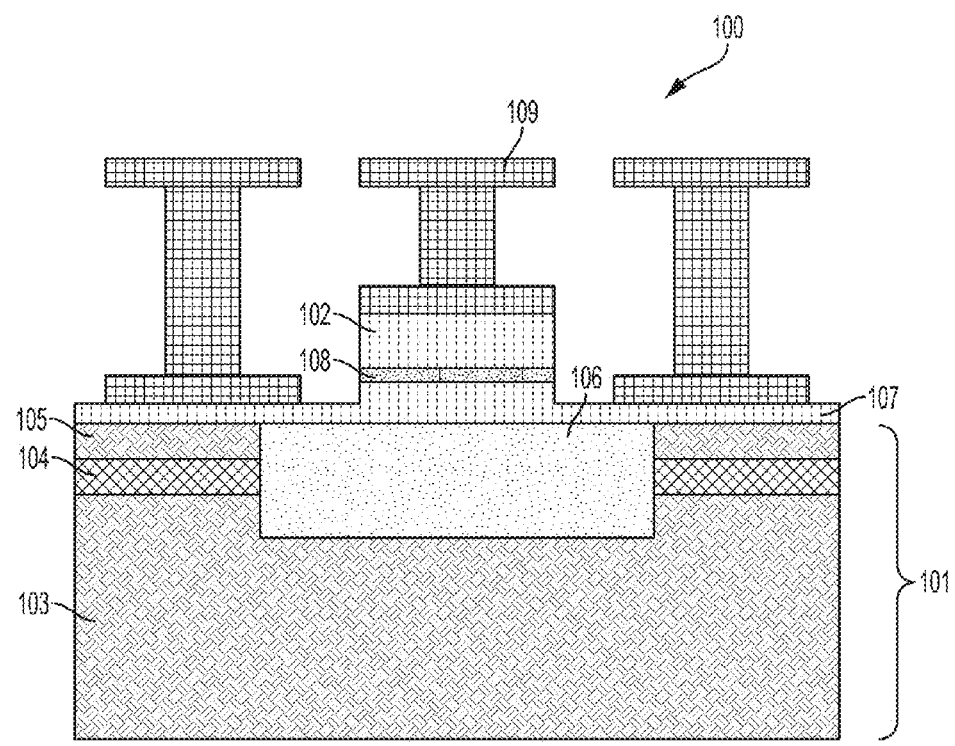
FIG. 5 is a diagram showing yet another example of the structure of an optical device according to an embodiment of the present invention.

By providing a quantum well layer 108, as shown in FIG. 5, an electrode 109 can be partially provided to impart the functions of an active device such as an optical modulator or a laser element.

A numerical analysis was performed on the light propagating characteristics of an optical device of the present invention using the three-dimensional beam propagation method. The results were as follows. The light propagating characteristics were propagation loss, etc. while functioning as an optical waveguide 102. The numerical analysis was performed using an air layer as the optical leakage preventing layer 106. The width and height of the air layer were w and h, as shown in FIG. 6, and traverse electric (TE) field polarized light having electric field components in the horizontal direction was applied.

Figure 6:
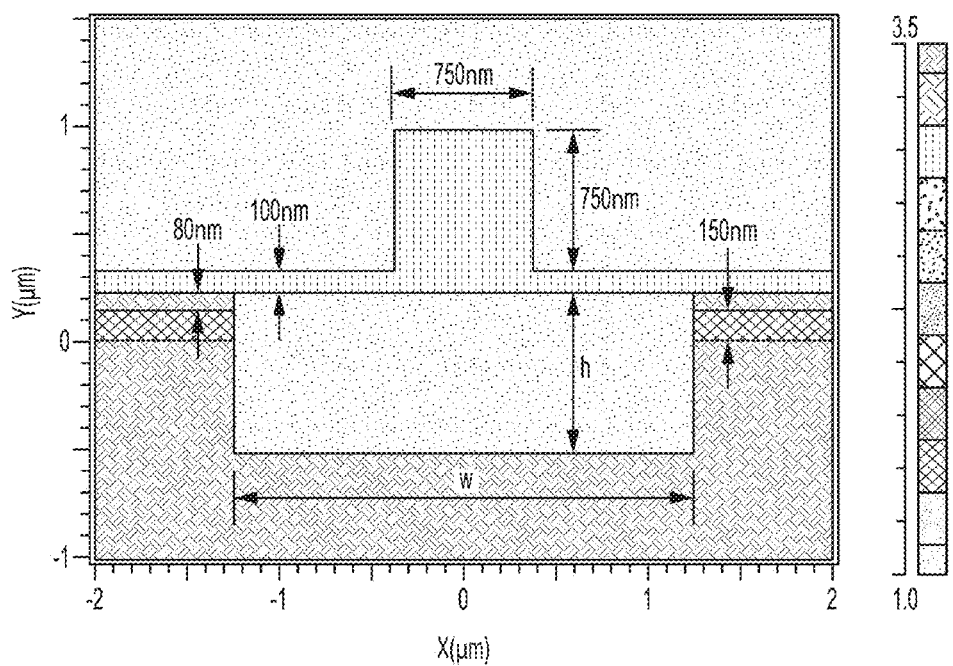
FIG. 6 is a diagram showing the refractive index distribution in a structural cross-section of the optical device shown in FIG. 3.

FIG. 6 is a diagram showing the refractive index distribution in a structural cross-section of the optical device. In FIG. 6, the horizontal axis denotes the width, and the vertical axis denotes the height or thickness. FIG. 6 indicates the refractive index using shading ranging from 1.0 to 3.5.

In the optical device, the thickness of the $SiO_2$ layer 104 constituting the SOI substrate 101 is 150 nm, and the thickness of the Si layer 105 is 80 nm. The width of the optical waveguide 102 is 750 nm, the height is 750 nm, and the thickness of the optical waveguide support layer 107 is 100 nm. As indicated in the figure, the refractive index of the Si substrate 103 and Si layer 105 is approximately 3.5, the refractive index of the optical waveguide 102 and the optical waveguide support layer 107 is approximately 3, the refractive index of the $SiO_2$ layer 104 is approximately 1.5, and the refractive index of the air layer is approximately 1.

FIG. 7 is a diagram showing the difference in the light intensity profile due to the presence or absence of an air bridge. In FIG. 7, the horizontal axis denotes the width, and the vertical axis denotes the height or thickness. FIG. 7 indicates the light intensity using shading ranging from 0.0 to 1.0.

Figure 7A:
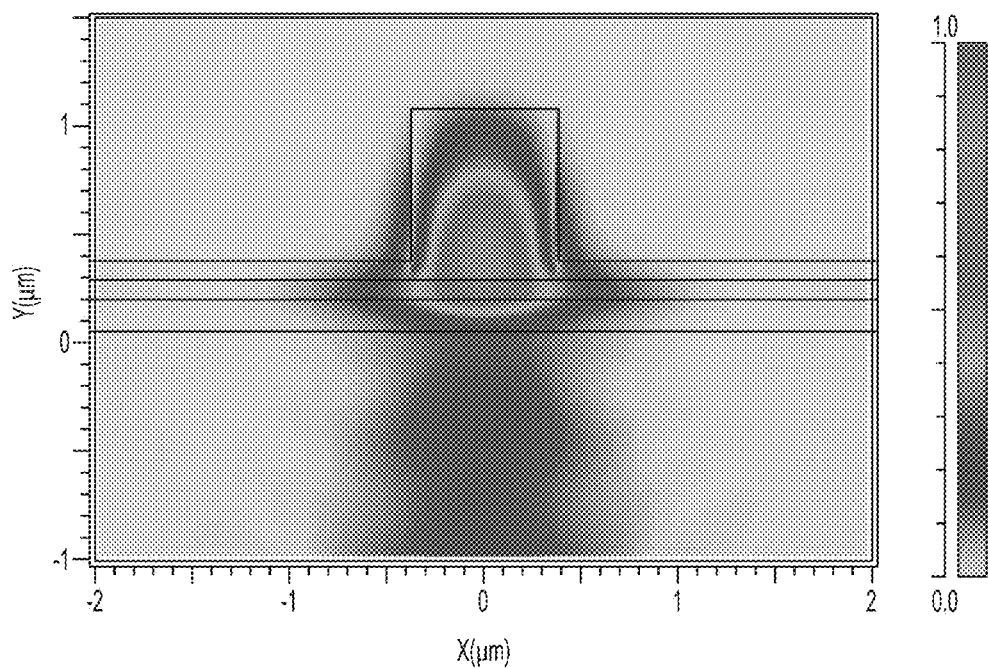
FIGS. 7(a) and 7(b) are diagrams showing the difference in the light intensity profile due to the presence or absence of an air bridge.
Figure 7B:
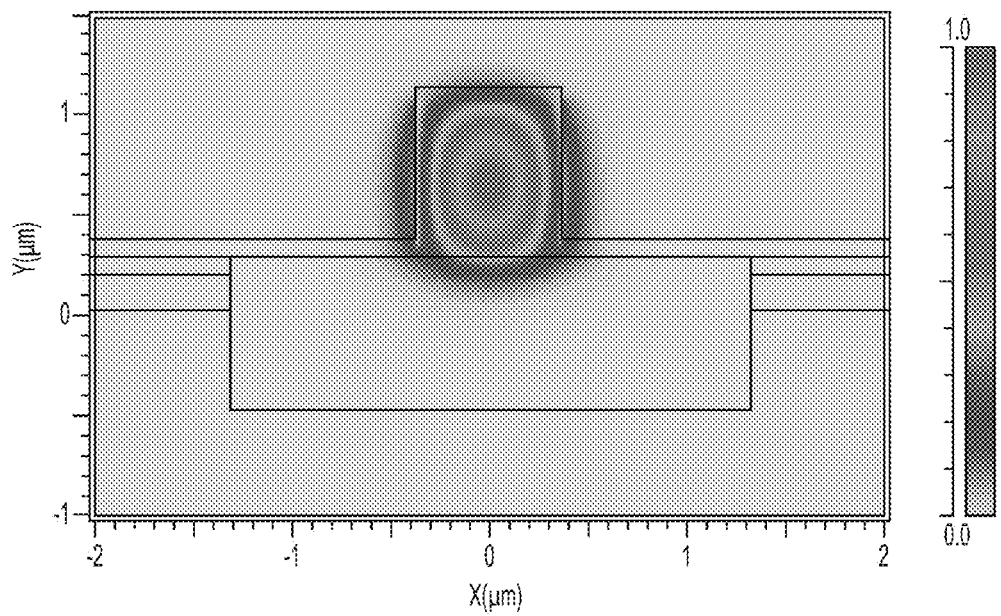

FIG. 7(a) shows the situation when there is no air bridge, and FIG. 7(b) shows the situation when there is an air bridge. When there is no air bridge as shown in FIG. 7(a), light travels beyond the $SiO_2$ layer 104 and leaks into the Si substrate 103. FIG. 7(a) shows the light intensity profile at a propagation distance of 5 μm. The incident light leaks almost immediately.

In contrast, FIG. 7(b) shows the situation when there is an air bridge. The optical leakage preventing layer 106 is an air layer which completely inhibits the leakage of light into the Si substrate 103 below. FIG. 7 (b) shows the light intensity profile at a propagation distance of 500 μm, which is 100 times the distance shown in FIG. 7 (a). Even after propagating such a long distance, there is no leakage of light. The light is completely confined inside the optical waveguide 102, and the intensity of the light is high. In other words, the formation of an air bridge has been found to enable highly efficient propagation of light.

Figure 8:
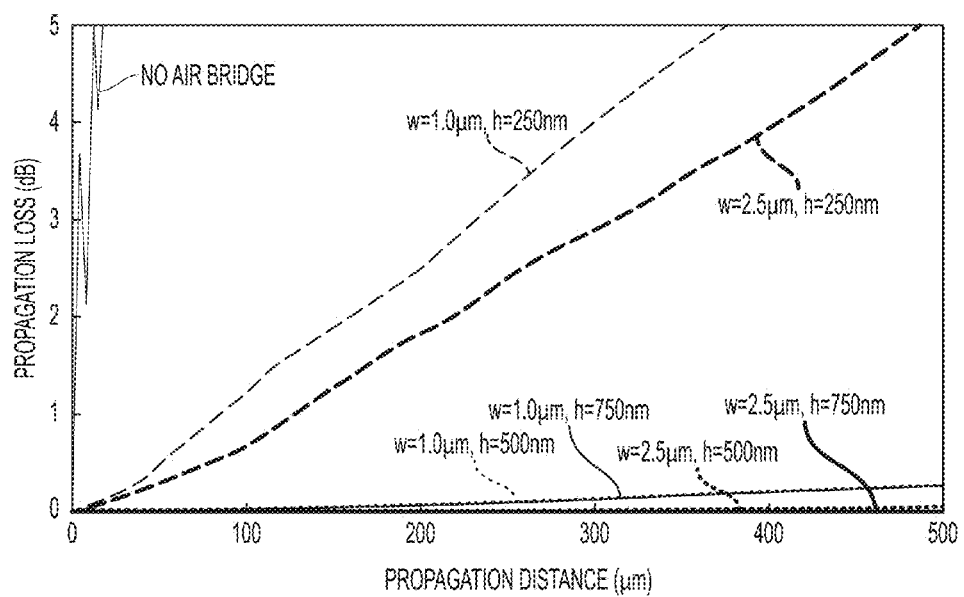
FIG. 8 is a diagram showing the relationship between the propagation distance and propagation loss of light.

FIG. 8 is a diagram showing the relationship between the propagation distance and propagation loss of light when there is no air bridge and when the width and height of the air layer are changed. The horizontal axis indicates the propagation distance (μm), and the vertical axis indicates the propagation loss (dB). FIG. 8 shows the results when the width w is changed to 1.0 μm and 2.5 μm, and when the height h is changed to 250 nm, 500 nm, and 750 nm.

As shown in FIG. 8, when there is no air bridge, there is a sharp increase in propagation loss at short propagation distance, and light leaks into the Si substrate 103. When the height h is 500 nm or greater, and the width w is 1.0 μm or 2.5 μm, the propagation loss is 0.3 dB or less at a propagation distance of 500 μm. Therefore, good light propagating characteristics are obtained.

In the model used to perform the numerical analysis, the width and height of the optical waveguide 102 was 750 nm, and the thickness of the optical waveguide support layer 107 was 100 nm. Even though the optical waveguide support layer 107 was thin at 100 nm, it was proved to provide sufficient mechanical strength. The sufficient thickness was proved in the following way.

Figure 9A:
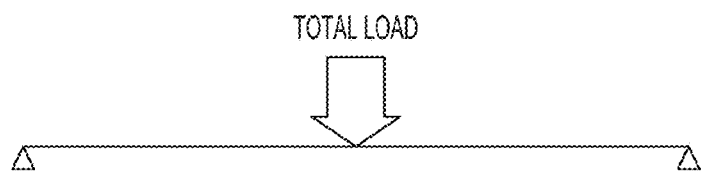
FIGS. 9(a) and 9(b) are diagrams showing a model of the air bridge structure.
Figure 9B:
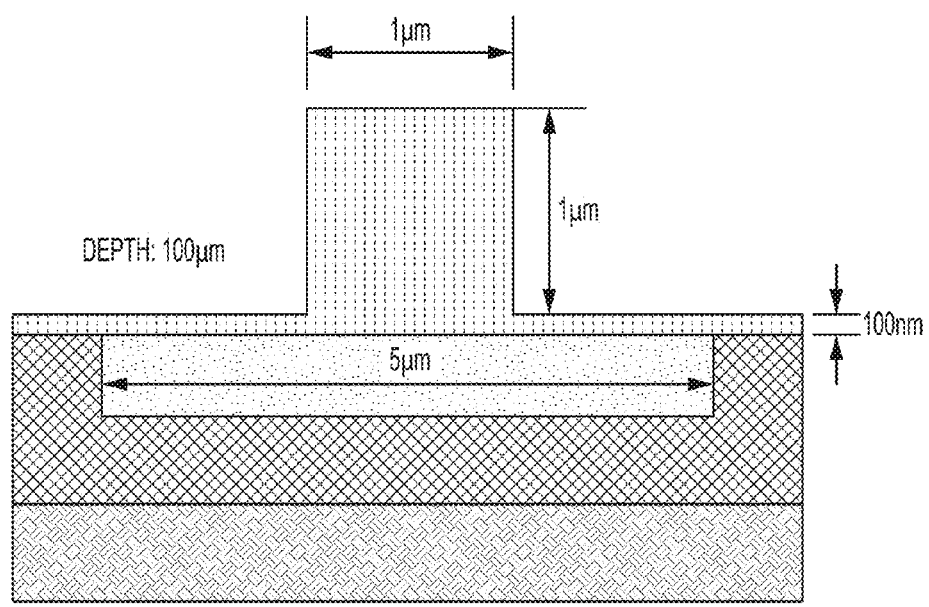

In the model of the bridge structure, it was assumed that the load on the optical waveguide 102 was concentrated in the middle of the optical waveguide support layer 107. In order to estimate the mechanical strength, a three-point load model was assumed as shown in FIG. 9(a). Parameters more vulnerable than those of an actual structure were established. Because the three-point model was more vulnerable than in an actual situation, the mechanical resistance of the model proves that the mechanical resistance of the actual structure is sufficient. The Group III-V compound semiconductor was assumed to be InP. Each of the parameters is shown in FIG. 9(b).

Because the density of InP is 4.78 g/cm³, the total load M on the Group III-V compound semiconductor layer, that is, the weight of the optical waveguide 102 and the optical waveguide support layer 107 is 4.78 g/cm³×(1 μm×1 μm+100 nm×5 μm)×100 μm=7.2×10⁻¹³ kg. The section modulus Z and the maximum stress σ of the bridge structure model can be calculated using Equation 1 and Equation 2 below, where D is the depth, H is the height, and L is the beam length.

$$Z = \frac{D \times H^2}{6}$$  Equation 1

$$\sigma = \frac{M \times L}{4 \times Z}$$  Equation 2

The section modulus Z of the beam (the Group III-V compound semiconductor layer) according to Equation 1 is 1.7×10⁻¹⁹ m³. The maximum stress σ calculated using Z and Equation 2 is 55 Pa. The yield stress of the Group III-V compound semiconductor at a temperature of 600° C. is 20 MPa. Because the stress (55 Pa) on the air bridge structure due to its own weight is sufficiently lower than the yield stress (approximately 20 MPa), the air bridge structure has sufficient mechanical strength.

Sufficient mechanical strength can be ensured even when the optical waveguide support layer 107 is 100 nm. However, in the following example, the parameters for a more robust structure were calculated under the assumption that there are cases when the mechanical strength may be doubtful, such as when excessive force is applied during the manufacturing process.

Figure 10:
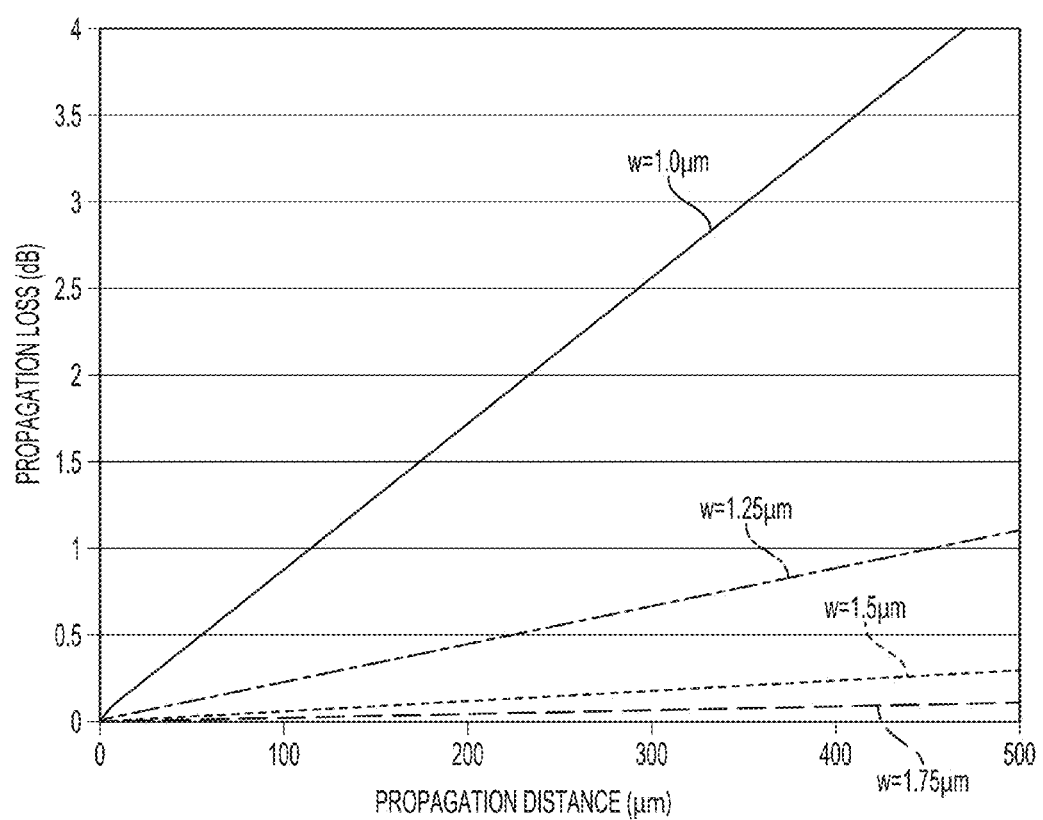
FIG. 10 is a diagram showing the relationship between the propagation distance and propagation loss of light when the thickness of the Group III-V compound semiconductor layer and the height of the optical waveguide are changed.
Figure 11A:
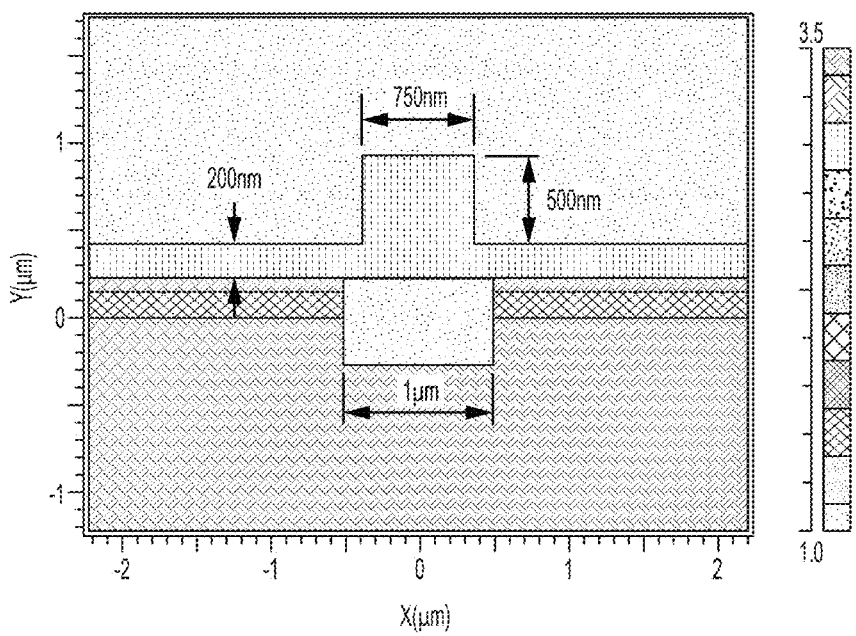
FIGS. 11(a) and 11(b) are diagrams showing the refractive index distribution in the structural cross-section and the light intensity profile of the optical device when w=1 μm in FIG. 10.
Figure 11B:
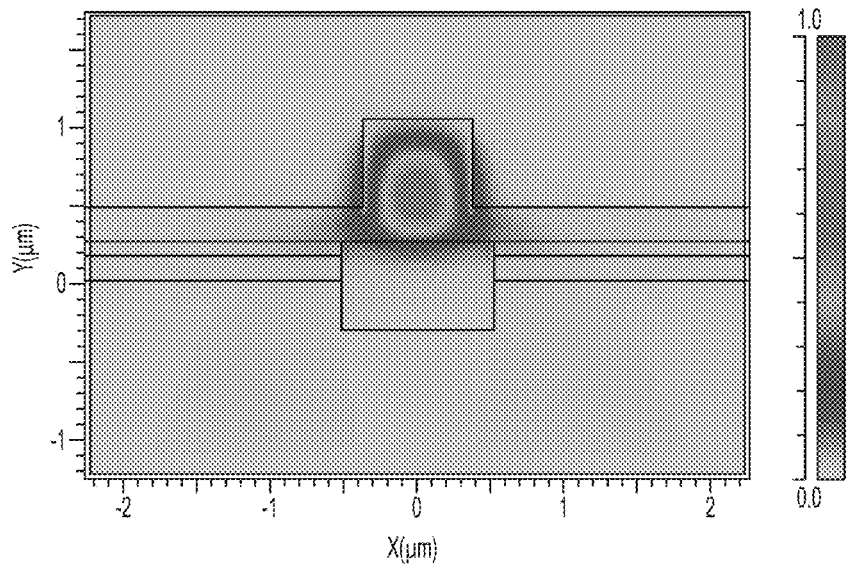

In the parameters for a more robust structure, the thickness of the optical waveguide support layer 107 was increased to 200 nm, and the height h of the optical waveguide 102 was reduced to 500 nm. FIG. 10 shows the relationship between propagation distance and propagation loss when a numerical analysis was performed after changing the width of the air layer. As shown in FIG. 11(a), even at 1.0 μm, which is the narrowest width w for the air layer, the propagation loss was less than 5 dB at a propagation distance of 500 μm, and characteristics were obtained which can withstand serving the functions of the optical waveguide 102. As shown in FIG. 11(b), there was hardly any leakage of light into the Si substrate 103.

Figure 12A:
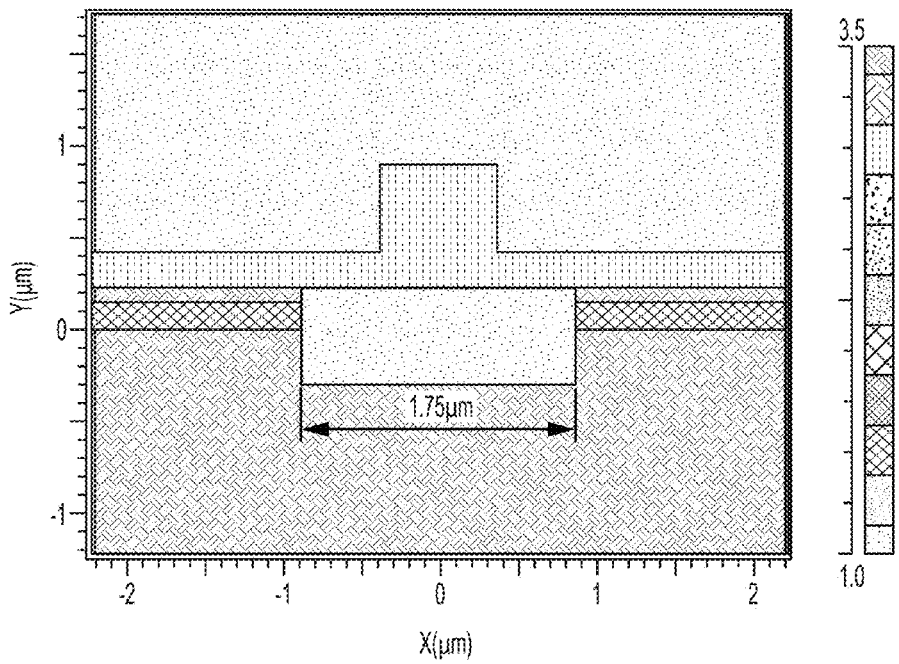
FIGS. 12(a) and 12(b) are diagrams showing the refractive index distribution in the structural cross-section and the light intensity profile of the optical device when w=1.75 μm in FIG. 10.
Figure 12B:
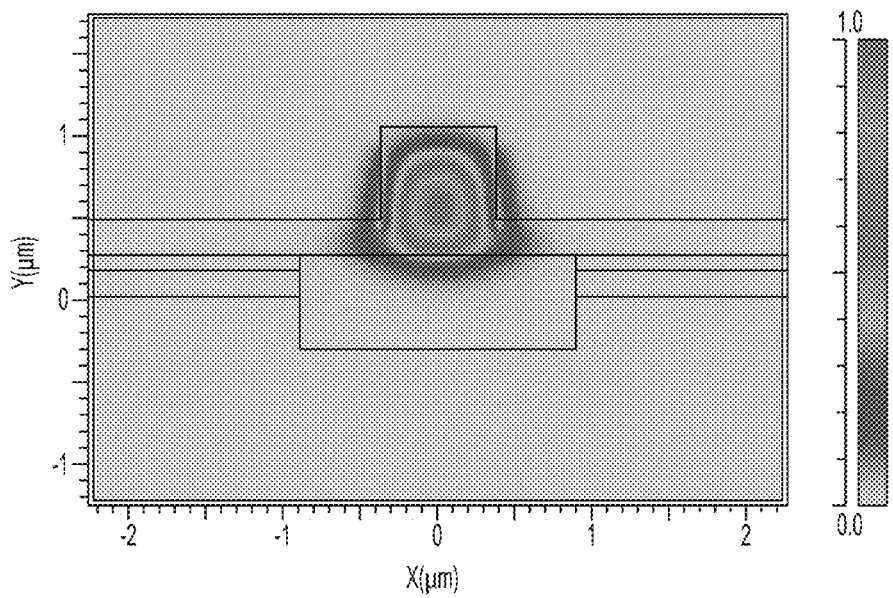

As shown in FIG. 12(a), when the width w for the air layer is a wider 1.75 μm, the propagation loss was less than 0.1 dB at a propagation distance of 500 μm, and these characteristics were sufficient for the functions of the optical waveguide 102. As shown in FIG. 12(b), the light intensity was higher than the width w of 1.0 μm shown in FIG. 11(a), and hardly any light leaked into the Si substrate 103. Therefore, it is clear that the optical waveguide 102 functions better when the air layer is wider.

In addition to the optical waveguide 102, an optical element such as a laser element, an optical modulator, or photodetector can be provided in the optical device 100. Assuming the total propagation distance of these optical elements to be 500 μm, the optical loss is 4.25 dB per 500 μm of propagation distance even when the width of the air layer is at its narrowest (1.0 μm). Therefore, demands for a maximum allowable propagation loss of 5 dB or less can be met.

The method used to manufacture the structure of the optical device 100 shown in FIG. 4 will now be explained with reference to FIG. 13 through FIG. 15. This structure can be manufactured using methods common in the art. First, an SOI substrate 101 is prepared. The SOI substrate 101 can be manufactured using any method common in the art. An SOI substrate 101 with an embedded insulating layer can be manufactured by preparing a Si substrate 103, using ion implantation to embed oxygen molecules in the Si crystal surface of the Si substrate 103, and then annealing and oxidizing the substrate to form a $SiO_2$ layer 104 in the silicon crystals. The $SiO_2$ layer 104 on the SOI substrate 101, and the Si layer 105 on top of this are formed to a thickness of 200 nm or less for use in the CMOS process.

Figure 13A:
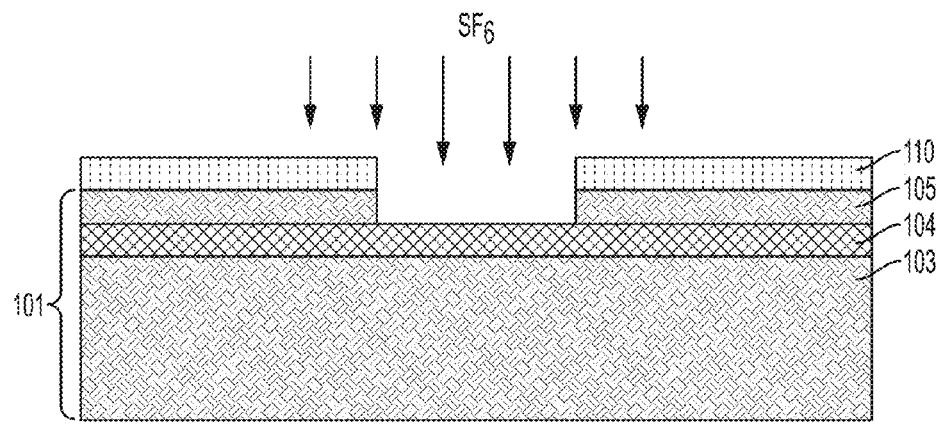
FIGS. 13(a), 13(b), and 13(c) are diagrams showing the structure of the device manufactured in each step.

As shown in FIG. 13(a), a photoresist 110 is applied on top of the SOI substrate 101 using spin coating, and this is exposed to light and developed to form a pattern. Using the photoresist 110 as a mask and an etching gas such as $SF_6$, $CCl_4$, or $CF_4$, the Si layer 105 exposed by the mask is etched to remove the Si layer 105. The etching can be performed at a rate of 60 to 100 nm per minute.

Figure 13B:
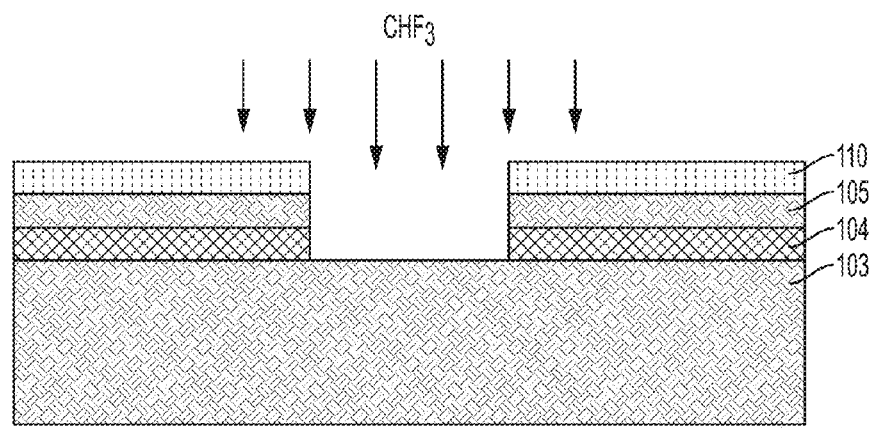

Next, as shown in FIG. 13(b), using an etching gas such as $CHF_3$ or $C_2F_6$, the portions of the $SiO_2$ layer 104 exposed by the mask are etched to remove the $SiO_2$ layer 104. The etching can be performed at a rate of 20 to 50 nm per minute.

Figure 13C:
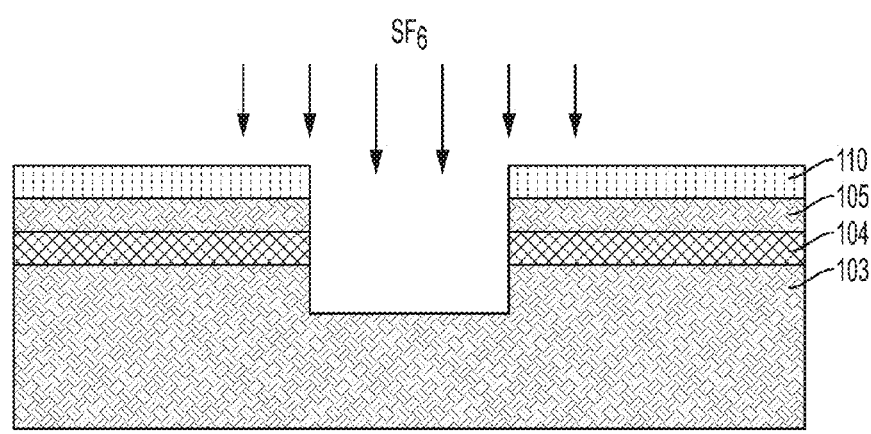

Next, as shown in FIG. 13(c), using the same etching gas as the one used on the Si layer 105, the portion of the Si substrate 103 exposed by the mask is etched to remove a portion of the Si substrate 103. Here, the Si substrate 103 is etched and removed to a predetermined depth. The etching can be performed at a rate of 60 to 100 nm per minute. The predetermined depth is determined based on the height of the air layer required to prevent leakage of light from inside the optical waveguide 102 towards the Si substrate 103.

A Group III-V compound semiconductor layer 111 with an interposed quantum well layer 108 is formed, and the photoresist 110 on top of the SOI substrate 101 with a groove etched into it as shown in FIG. 13(c) is removed. This structure can be manufactured by interposing a nanometer-thin barrier layer with a large bandgap using molecular beam epitaxy (MBE) or metal-organic vapor deposition (MOCVD). The photoresist 110 can be removed by performing ashing using ozone or plasma, or by dissolving the resist in a wet process using an organic solvent.

Figure 14A:
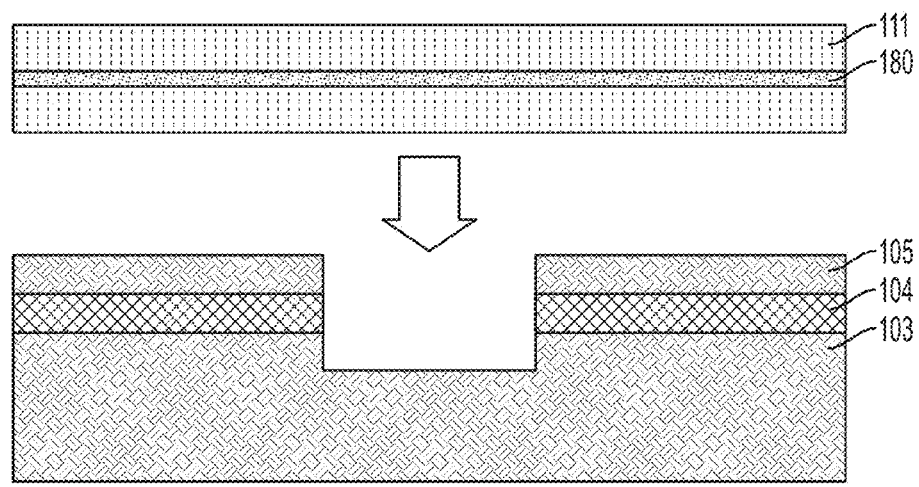
FIGS. 14(a) and 14(b) are diagrams showing the structure of the device manufactured in each step.
Figure 15:
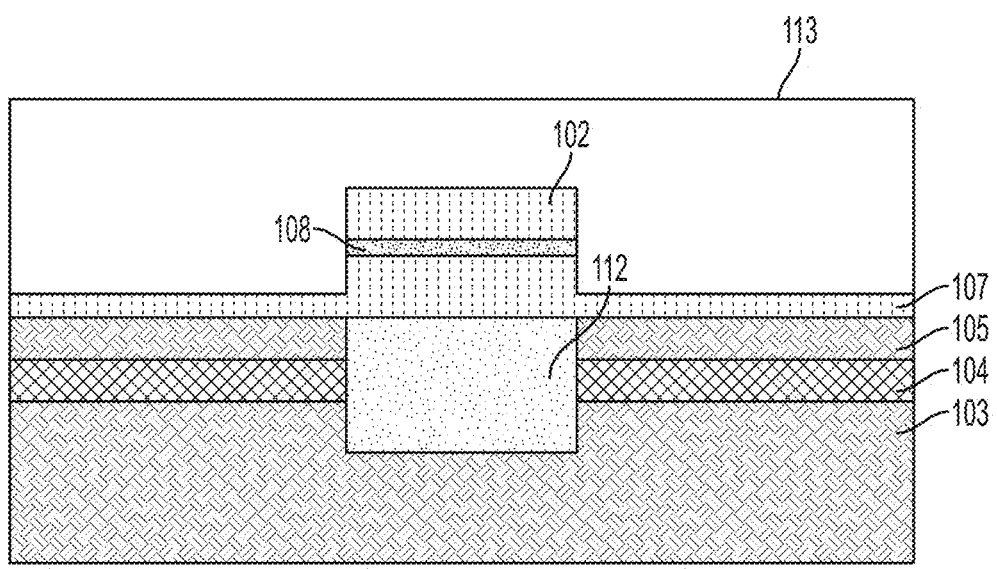
FIG. 15 is a diagram showing the structure of the device manufactured in an additional step.

As shown in FIG. 14(a), the molecular bonding method (see, for example, UCSB, Laser & Photonics Reviews, 1-29 (2010)) is used to bond and integrate the Group III-V compound semiconductor layer 111 including an interposed quantum well layer 108 with a SOI substrate 101 including a groove. The bonding is performed with the opening in the groove facing the Group III-V compound semiconductor layer 111. The upper end of the groove is completely covered to form the air layer 112 that serves as the optical leakage preventing layer 106.

In the molecular bonding method, the oxide on the surface of the SOI substrate 101 is removed by rinsing the surface with HF or $NH_4OH$. The rinsed hydrophobic surface is converted to a hydrophilic surface by performing $O_2$ plasma surface treatment. Next, the surface is brought into contact with an aqueous solution to generate high-density hydroxyl groups on the surface. The two substrates are annealed at a temperature such as 300° C., and the two substrates are bonded by the formation of a strong covalent bond.

Figure 14B:
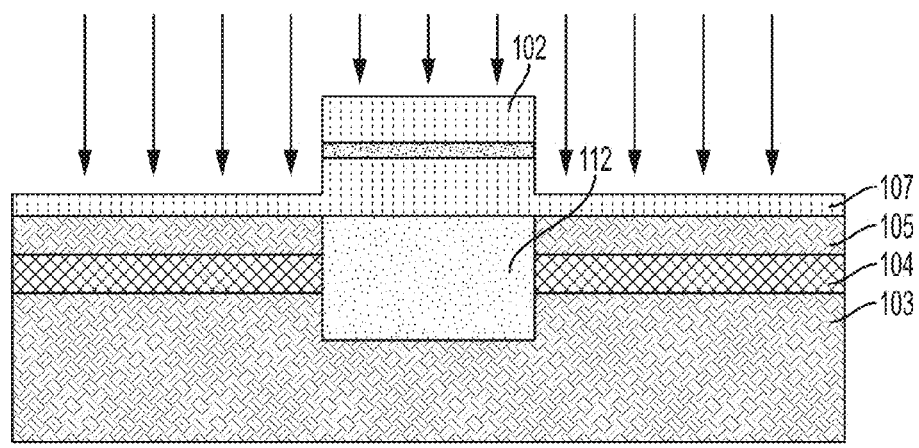

As shown in FIG. 14(b), reactive ion etching is performed to remove a portion of the optical waveguide 102, and to etch the remaining portion to a predetermined depth. A fluorine-based or other halogen-based etching gas can be used in the reactive ion etching. Instead of reactive ion etching, wet etching can be performed using an etchant such as nitric acid, hydrochloric acid, or hydrofluoric acid. In this way, an optical device 100 with an air bridge structure is provided as shown in FIG. 4 in which the optical waveguide 102 is supported over an air layer by an optical waveguide support layer 107. When the mechanical strength is insufficient, as shown in FIG. 15, the optical waveguide 102 and the optical waveguide support layer 107 can be coated with a resin 113 such as polyimide or PMMA to provide a reinforcing resin layer.

Instead of an air layer, a resin layer can be formed as the optical leakage preventing layer 106. The resin layer can be formed by embedding a resin layer inside the groove shown in FIG. 13(c). After the bonding process, as shown in FIG. 14(a), a small hole is opened in the optical waveguide 102 or the optical waveguide support layer 107, and the groove is filled by pouring or blowing in gaseous resin components to form the resin layer. This is merely an example. Another method can be used.

In this way, the present invention is able to provide an optical device enabling integration of an optical circuit on an SOI substrate having an insulating layer of the same thickness commonly used in the CMOS process, and realization of a perfect match between the silicon photonics and the CMOS process.

The optical device and optical device manufacturing method of the present invention were explained using specific embodiments, but the present invention is not limited to these specific embodiments and examples. The present invention can be altered in any way conceivable by a person of skill in the art, including other embodiments, additions, modifications, and deletions. Any mode or aspect realizing the actions and effects of the present invention is within the scope of the present invention.

REFERENCE SIGNS LIST

10: Si substrate
11: SiO$_2$ layer
12: Si waveguide
13: Air layer
100: Optical device
101: SOI substrate
102: Optical waveguide
103: Si substrate
104: SiO$_2$ layer
105: Si layer
106: Optical leakage preventing layer
107: Optical waveguide support layer
108: Quantum well layer
109: Electrode
110: Photoresist
111: Group III-V compound semiconductor layer
112: Air layer
113: Resin

The invention claimed is:

1. A method for manufacturing an optical device, the method comprising:
    etching an SOI substrate having an embedded insulating layer with a thickness of 200 nm or less to form a groove passing through the insulating layer from the surface of the SOI substrate;
    forming a Group III-V compound semiconductor layer;
    bonding together the SOI substrate with a formed groove and the Group III-V compound semiconductor layer so the opening of the groove faces the Group III-V compound semiconductor layer; and
    etching the Group III-V compound semiconductor layer to form an optical waveguide.

2. The method of claim 1, further comprising forming the optical waveguide with a width narrower than the width of the groove.

3. The method of claim 1, wherein an air layer is formed by the groove covered by the Group III-V compound semiconductor layer in the bonding, and an optical waveguide support layer for supporting the optical waveguide is formed on top of the air layer at the same time as the optical waveguide during forming the optical waveguide.

4. The method of claim 1, further comprising forming a resin film to cover the optical waveguide.

5. The method of claim 1, wherein the Group III-V compound semiconductor layer is formed so as to include at least one quantum well layer in forming the Group III-V compound semiconductor layer.

* * * * *